United States Patent
Shin

(10) Patent No.: US 11,581,041 B2
(45) Date of Patent: Feb. 14, 2023

(54) NONVOLATILE MEMORY APPARATUS PERFORMING CONSECUTIVE ACCESS OPERATIONS AND AN OPERATION METHOD OF THE NONVOLATILE MEMORY APPARATUS

(71) Applicant: SK hynix Inc., Icheon-si (KR)

(72) Inventor: Min Chul Shin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/163,077

(22) Filed: Jan. 29, 2021

(65) Prior Publication Data
US 2022/0028451 A1  Jan. 27, 2022

(30) Foreign Application Priority Data
Jul. 27, 2020  (KR) .................. 10-2020-0092988

(51) Int. Cl.
G11C 8/08 (2006.01)
G11C 11/00 (2006.01)
G11C 13/00 (2006.01)

(52) U.S. Cl.
CPC ........ G11C 13/0026 (2013.01); G11C 13/004 (2013.01)

(58) Field of Classification Search
CPC .............. G11C 13/0026; G11C 13/004; G11C 11/1673; G11C 11/1655; G11C 2213/76; G11C 7/06; G11C 7/12; G11C 8/08; G11C 8/06; G11C 8/10; G11C 13/0028; G11C 13/003
See application file for complete search history.

(56) References Cited

U.S. PATENT DOCUMENTS

| | | | |
|---|---|---|---|
| 9,384,830 B2 | 7/2016 | Balluchi et al. | |
| 2010/0142249 A1* | 6/2010 | Choi | G11C 7/18 365/163 |
| 2012/0147655 A1* | 6/2012 | Lee | G11C 13/0069 365/171 |
| 2017/0256319 A1 | 9/2017 | Balluchi et al. | |

* cited by examiner

*Primary Examiner* — Hien N Nguyen
(74) *Attorney, Agent, or Firm* — William Park & Associates Ltd.

(57) ABSTRACT

A nonvolatile memory apparatus includes a memory cell array and a memory control circuit. The memory cell array includes a plurality of sub arrays each including a plurality of memory cells coupled to a plurality of bit lines. The memory control circuit sequentially couples thereto, based on a single read command signal, at least a single bit line disposed on the respective sub arrays to sequentially access a memory cell coupled to the at least single bit line.

16 Claims, 5 Drawing Sheets

NONVOLATILE MEMORY APPARATUS PERFORMING CONSECUTIVE ACCESS OPERATIONS AND AN OPERATION METHOD OF THE NONVOLATILE MEMORY APPARATUS

CROSS-REFERENCES TO RELATED APPLICATION

The present application claims priority under 35 U.S.C. § 119(a) to Korean application number 10-2020-0092988, filed on Jul. 27, 2020, in the Korean Intellectual Property Office, which is incorporated herein by reference in its entirety as set forth in full.

BACKGROUND

1. Technical Field

Various embodiments are related to an integrated circuit technology, and more particularly, to a nonvolatile memory apparatus and a semiconductor system including the nonvolatile memory apparatus.

2. Related Art

Each of electronic devices includes a lot of electronic elements, and a computer system among the electronic devices includes lots of electronic elements each comprising a semiconductor. The computer system may include a memory apparatus. A dynamic random access memory (DRAM) can store and output data at high and constant speed and capable of a random access. Such advantages make the DRAM widely used as a general memory apparatus. However, the DRAM includes memory cells each composed of a capacitor, which makes the DRAM have a volatile characteristic of losing data stored therein when power supply is cut off. In order to overcome such a disadvantage of the DRAM, a flash memory apparatus has been developed. The flash memory apparatus includes memory cells each composed of a floating gate, which makes the flash memory apparatus have a nonvolatile characteristic of keeping data stored therein even when a power supply is cut off. However, the flash memory apparatus stores and outputs data at lower speed than the DRAM and incapable of the random access.

Recently, next-generation memory apparatuses having a high operation speed and nonvolatile characteristics have been developed. Examples of the next-generation memory apparatuses may include a phase change memory (PCM), a magnetic RAM (MRAM), a resistive RAM (ReRAM) and a ferroelectric RAM (FRAM), The next-generation memory apparatuses can operate at high speeds while having nonvolatile characteristics. In particular, the PRAM includes memory cells formed of chalcogenide and can store data by changing the resistance values of the memory cells.

SUMMARY

In an embodiment, a nonvolatile memory apparatus may include a memory cell array and a memory control circuit. The memory cell array may include a plurality of sub arrays each including a plurality of memory cells coupled to a plurality of bit lines. The memory control circuit may sequentially couple to, based on a single read command signal, at least one bit line respectively disposed on the respective sub arrays to sequentially read data from a memory cell coupled to the at least one bit line.

In an embodiment, an operating method of a nonvolatile memory apparatus may include charging a global bit line and a local bit line coupled to the global bit line based on a single read command signal. The operating method may include coupling the local bit line to a first bit line disposed on a first sub array and reading data from a memory cell coupled to the first bit line. And the operating method may include coupling the local bit line to a second bit line disposed on a second sub array and reading data from a memory cell coupled to the second bit line.

In an embodiment, a nonvolatile memory apparatus may include a controller, a column selecting circuit, a column control circuit and a plurality of sense amplifiers. The controller may generate a column address signal based on an address signal, and sequentially enable a plurality of different local column selecting signals while a global column selecting signal is enabled on a basis of the column address signal. The column selecting circuit may select a local bit line to be coupled to a selected global bit line on a basis of the global column selecting signal and couple at least one bit line on a respective plurality of sub arrays to the selected local bit line based on the plurality of local column selecting signals. The column control circuit may provide a column access voltage to the selected global bit line based on a read command signal. The plurality of sense amplifiers may be respectively coupled to a plurality of memory cells coupled to the at least one bit line on the respective sub arrays and may read data from the plurality of memory cells to generate output data.

DETAILED DESCRIPTION

Figure 1:
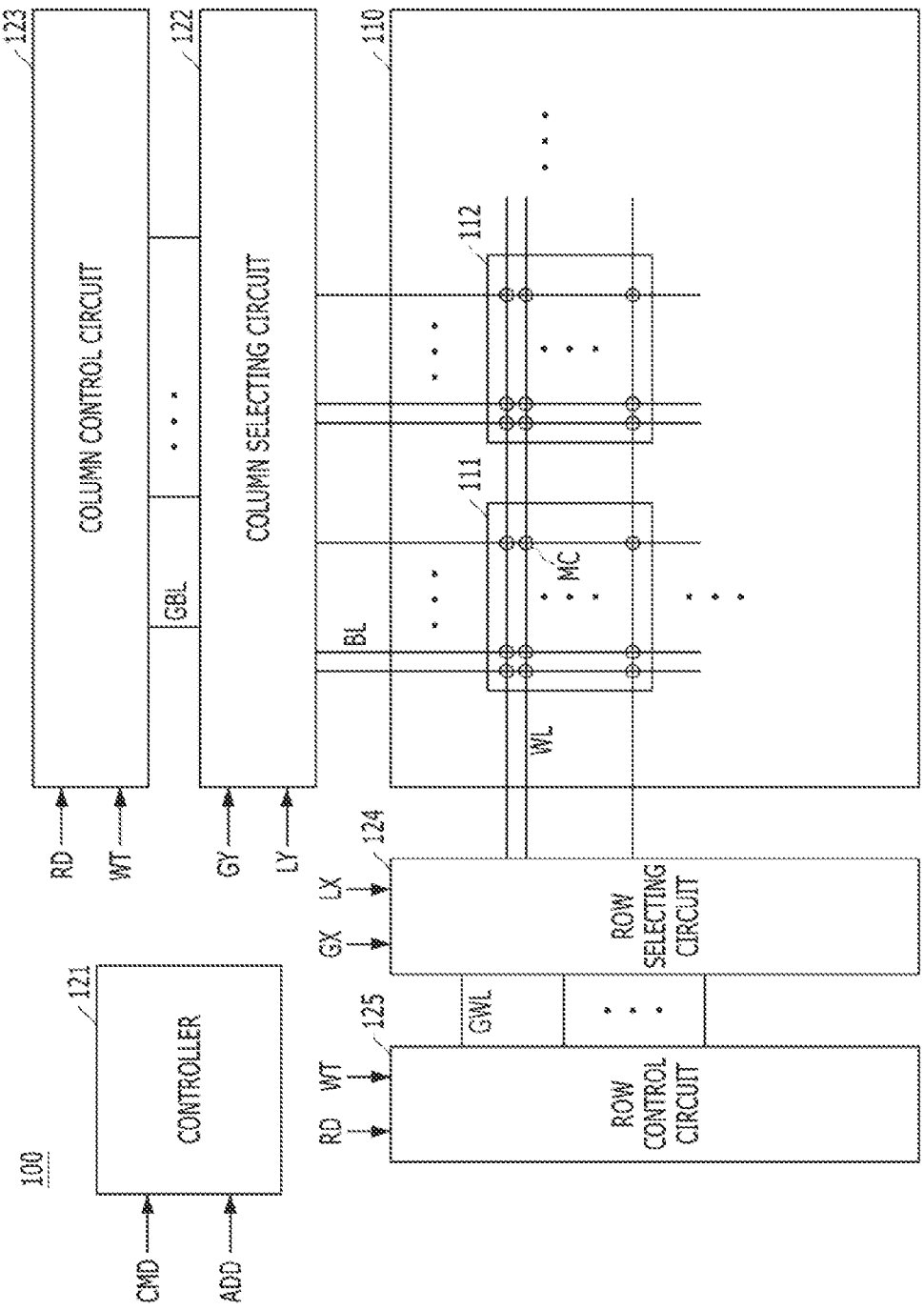
FIG. 1 is a diagram illustrating a configuration of a nonvolatile memory apparatus in accordance with an embodiment.

FIG. 1 is a diagram illustrating a configuration of a nonvolatile memory apparatus 100 in accordance with an embodiment. Referring to FIG. 1, the nonvolatile memory apparatus 100 may include a memory cell array 110 and a memory control circuit. The memory cell array 110 may include a plurality of memory banks (not illustrated) each having a plurality of sub arrays 111 and 112. A plurality of bit lines BL and a plurality of word lines WL may be disposed on each of the plurality of sub arrays 111 and 112. A plurality of memory cells MC may be coupled to respective cross points between the plurality of bit lines BL and the plurality of word lines WL For example, FIG. 1 illustrates the plurality of sub arrays 111 and 112 within a single memory bank. Four, eight, sixteen, thirty-two numbers of sub arrays or more may be included within a single memory bank although FIG. 1 illustrates, for example, two sub arrays within a single memory bank. Each of the plurality of memory cells MC may be a nonvolatile memory cell. Each of the plurality of memory cells MC may include a storage element and a switching element coupled to each other. The storage element may retain a physical status, which corresponds to data stored therein, for a long time even without refresh operation or re-write operation. Each of the plurality of memory cells MC may be accessed when a higher voltage than a threshold voltage is applied to a corresponding switching element coupled to a corresponding storage element. When the higher voltage than the threshold voltage is applied, the switching element may be turned on and/or snapped back and the memory cell MC may become ready to allow current to flow therethrough. The storage element may include a floating gate of a dual gate transistor, a phase change material, a variable resistance material and so forth. The nonvolatile memory apparatus 100 may include a phase change memory (PCM), a resistive RAM (ReRAM), a spin torque transfer magneto-resistive RAM (STT-MRAM). The switching element may include a diode, an ovonic threshold switch, a tunnel junction or a two-port switching element such as a mixed ionic and electronic conductor. In an embodiment, the switching element may include a three-port switching element such as field effect transistor (FET) or bipolar junction transistor (BJT).

The memory cell array 110 may include a hierarchical connection structure. A plurality of global bit lines GBL and a plurality of local bit lines (not illustrated) may be disposed on the memory cell array 110. Each of the plurality of global bit lines GBL may be coupled to the plurality of local bit lines each coupled to the plurality of bit lines BL. Therefore, each of the plurality of memory cells MC of the memory cell array 110 may be accessed through sequential selection of the plurality of global bit lines GBL, the plurality of local bit lines and the plurality of bit lines BL. A plurality of global word lines GWL and a plurality of local word lines (not illustrated) may be disposed on the memory cell array 110. Each of the plurality of global word lines GWL may be coupled to the plurality of local word lines each coupled to the plurality of word lines WL. Therefore, each of the plurality of memory cells MC of the memory cell array 110 may be accessed through sequential selection of the plurality of global word lines GWL, the plurality of local word lines and the plurality of word lines WL.

The memory control circuit may access the plurality of memory cells MC of the memory cell array 110, The memory control circuit may read data from the plurality of memory cells MC of the memory cell array 110, The memory control circuit may write data into the plurality of memory cells MC of the memory cell array 110. The memory control circuit may receive a command signal CMD and an address signal ADD from an external apparatus (not illustrated). The external apparatus may be a host such as a memory controller configured to control an operation of the nonvolatile memory apparatus 100. Although not limiting thereto, the command signal CMD may include a read command signal and a write command signal. In response to the read command signal, the memory control circuit may read data from the plurality of memory cells MC of the memory cell array 110 and provide the read data to the external apparatus. In response to the write command signal, the memory control circuit may store data, provided from the external apparatus, into the plurality of memory cells MC of the memory cell array 110.

The memory control circuit may generate column address signal and row address signal based on the address signal ADD. The memory control circuit may generate a column selecting signal based on the column address signal. The column selecting signal may include global column selecting signal GY and local column selecting signal LY. The memory control circuit may select, based on the column selecting signal, one specific global bit line from among the plurality of global bit lines GBL, one specific local bit line from among the plurality of local bit lines and one specific bit line from among the plurality of bit lines BL to access one specific memory cell from among the plurality of memory cells MC. The memory control circuit may couple specific global bit lines and specific local bit lines to each other based on the global column selecting signal GY. The memory control circuit may couple the specific local bit line and a specific bit line to each other based on the local column selecting signal LY. The memory control circuit may generate a row selecting signal based on the row address signal. The row selecting signal may include a global row selecting signal CX and a local row selecting signal LX. The memory control circuit may select, based on the row selecting signal, one specific global word line from among the plurality of global word lines GWL, one specific local word line from among the plurality of local word lines and one specific word line from among the plurality of word lines WL to access one specific memory cell from among the plurality of memory cells MC. The memory control circuit may couple specific global word lines and specific local word lines to each other based on the global row selecting signal GX. The memory control circuit may couple the specific local word line and a specific word line to each other based on the local row selecting signal LX.

Based on the read command signal, the memory control circuit may apply a first voltage to a selected global bit line and a second voltage to a selected global word line. The first voltage may be a column access voltage and the second voltage may be a row access voltage. Voltage level difference between the first voltage and the second voltage may correspond to a voltage level of a read voltage, which is applied across the accessed memory cell. In response to the write command signal, the memory control signal may apply one voltage between a third voltage and a fourth voltage to a selected global bit line and may apply a fifth voltage to a selected global word line. Each of the third voltage and fourth voltage may be a column access voltage and the fifth voltage may be a row access voltage. Voltage level difference between one of the third and fourth voltages and the fifth voltage may correspond to a voltage level of a write voltage, which is applied across the accessed memory cell. The voltage level difference between the third voltage and the fifth voltage may correspond to a voltage level of a reset write voltage. The voltage level difference between the fourth voltage and the fifth voltage may correspond to a voltage level of a set write voltage. The memory control circuit may apply a reset write voltage and/or a reset write current to the accessed memory cell to program the accessed memory cell into a reset state and/or a high-resistance state. The memory control circuit may apply a set write voltage and/or a set write current to the accessed memory cell to program the accessed memory cell into a set state and/or a low-resistance state. The fourth voltage may have a voltage level lower than the third voltage and higher than the first voltage. The second voltage may have a voltage level higher than the fifth voltage and lower than the first voltage.

In response to a single command signal, the memory control circuit may consecutively perform a plurality of access operations to sequentially access the plurality of memory cells MC, For example, in response to a single read command signal, the memory control circuit may be sequentially coupled to the plurality of bit lines BL and may sequentially read data from the plurality of memory cells MC coupled to the plurality of bit lines BL. The memory control circuit may be sequentially coupled to individual bit lines disposed on the respective sub arrays 111 and 112. Based on the address signal ADD provided together with the single read command signal, the memory control circuit may be sequentially coupled to individual bit lines disposed on the respective sub arrays 111 and 112. For example, according to a column address signal generated on the basis of the address signal ADD, the memory control circuit may generate a global column selecting signal GY and a local column selecting signal LY. Based on the global column selecting signal GY, the memory control circuit may select a single global bit line and a single local bit line. Based on the local column selecting signal LY, the memory control circuit may couple the selected local bit line to at least a specific bit line disposed on the first sub array 111 to read data from a memory cell coupled to the specific bit line. After reading data from the memory cell within the first sub array 111, the memory control circuit may change the logic level of the column address signal. For example, the memory control circuit may increase or decrease code values of partial bits within the column address signal. The partial bits within the column address signal may have information for selecting a specific one sub array among the plurality of sub arrays 111 and 112. Based on the changed column address signal, the memory control circuit may couple the selected local bit line to at least a specific bit line disposed on the second sub array 112 to read data from a specific memory cell coupled to the specific bit line.

The memory control circuit may include a controller 121, a column selecting circuit 122, a column control circuit 123, a row selecting circuit 124 and a row control circuit 125. The controller 121 may receive a command signal CMD and an address signal ADD provided from an external apparatus. The controller 121 may decode the command signal CMD to generate read signal RD and write signal WT. The controller 121 may decode the command signal CMD to generate the read signal RD when the command signal CMD is a read command signal. The controller 121 may decode the command signal CMD to generate the write signal WT when the command signal CMD is a write command signal.

The controller 121 may latch and/or decode the address signal ADD to generate a column address signal. The controller 121 may generate a column selecting signal based on the column address signal. The column selecting signal may include the global column selecting signal GY and the local column selecting signal LY. The controller 121 may enable a single global column selecting signal GY based on the column address signal. The controller 121 may change the code value of the column address signal at each predetermined time interval. For example, the controller 121 may change the code value of the column address signal as many times as a threshold number. The controller 121 may sequentially generate a plurality of different local column selecting signals LY at each predetermined time interval. Therefore, while the single global column selecting signal GY is enabled, the controller 121 may sequentially enable the plurality of different local column selecting signals LY. The plurality of different local column selecting signals LY may be exclusively enabled among one another. The word "predetermined" as used herein with respect to a parameter, such as a predetermined time interval, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The controller 121 may latch and/or decode the address signal ADD to generate a row address signal. The controller 121 may generate a row selecting signal based on the row address signal. The row selecting signal may include the global row selecting signal GX and the local row selecting signal LX. For example, the controller 121 may change the logic value of the row address signal to generate a plurality of row address signals respectively having different code values from one another. The controller 121 may generate a plurality of global row selecting signals GX and a plurality of local row selecting signals LX based on the plurality of row address signals, respectively.

The column selecting circuit 122 may receive the column selecting signal from the controller 121. Based on the column selecting signal, the column selecting circuit 122 may select a local bit line to be coupled to a global bit line GBL and may select a bit line BL to be coupled to the selected local bit line. Based on the global column selecting signal GY, the column selecting circuit 122 may select a local bit line to be coupled to a global bit line GBL. Based on the local column selecting signal LY, the column selecting circuit 122 may select a bit line BL to be coupled to the selected local bit line. The column control circuit 123 may receive the read signal RD and the write signal WT from the controller 121. Based on the read signal RD and the write signal WT, the column control circuit 123 may provide voltage and/or current to the global bit line GBL. For example, based on the read signal RD, the column control circuit 123 may provide the first voltage to the selected global bit line GBL to charge the global bit line GBL. Based on the write signal WT, the column control circuit 123 may provide the selected global bit line GBL with one voltage between the third voltage and the fourth voltage to charge the selected global bit line GBL. When the column selecting circuit 122 selects a specific bit line BL based on the global column selecting signal GY and the local column selecting signal LY, the column control circuit 123 may access a specific memory cell MC coupled to the specific bit line BL to read data from the specific memory cell MC or to write data into the specific memory cell MC.

The row selecting circuit 124 may receive the row selecting signal from the controller 121. Based on the row selecting signal, the row selecting circuit 124 may select a local word line to be coupled to a global word line GWL and may select a word line WL to be coupled to the selected local word line. Based on the global row selecting signal GX, the row selecting circuit 124 may select a local word line to be coupled to a global word line GWL. Based on the local row selecting signal LX, the row selecting circuit 124 may select a word line WL to be coupled to the selected local word line. The row control circuit 125 may receive the read signal RD and the write signal WT from the controller 121, Based on the read signal RD and the write signal WT, the row control circuit 125 may provide voltage and/or current to the global word line GWL. For example, based on the read signal RD, the row control circuit 125 may provide the second voltage to the selected global word line GWL. Based on the write signal WT, the row control circuit 125 may provide the fifth voltage to the selected global word line GWL, When the row selecting circuit 124 selects a specific word line WL based on the global row selecting signal GX and the local row selecting signal LX, the row control circuit 125 may access a specific memory cell MC coupled to the specific word line WL to read data from the specific memory cell MC or to write data into the specific memory cell MC.

Figure 2:
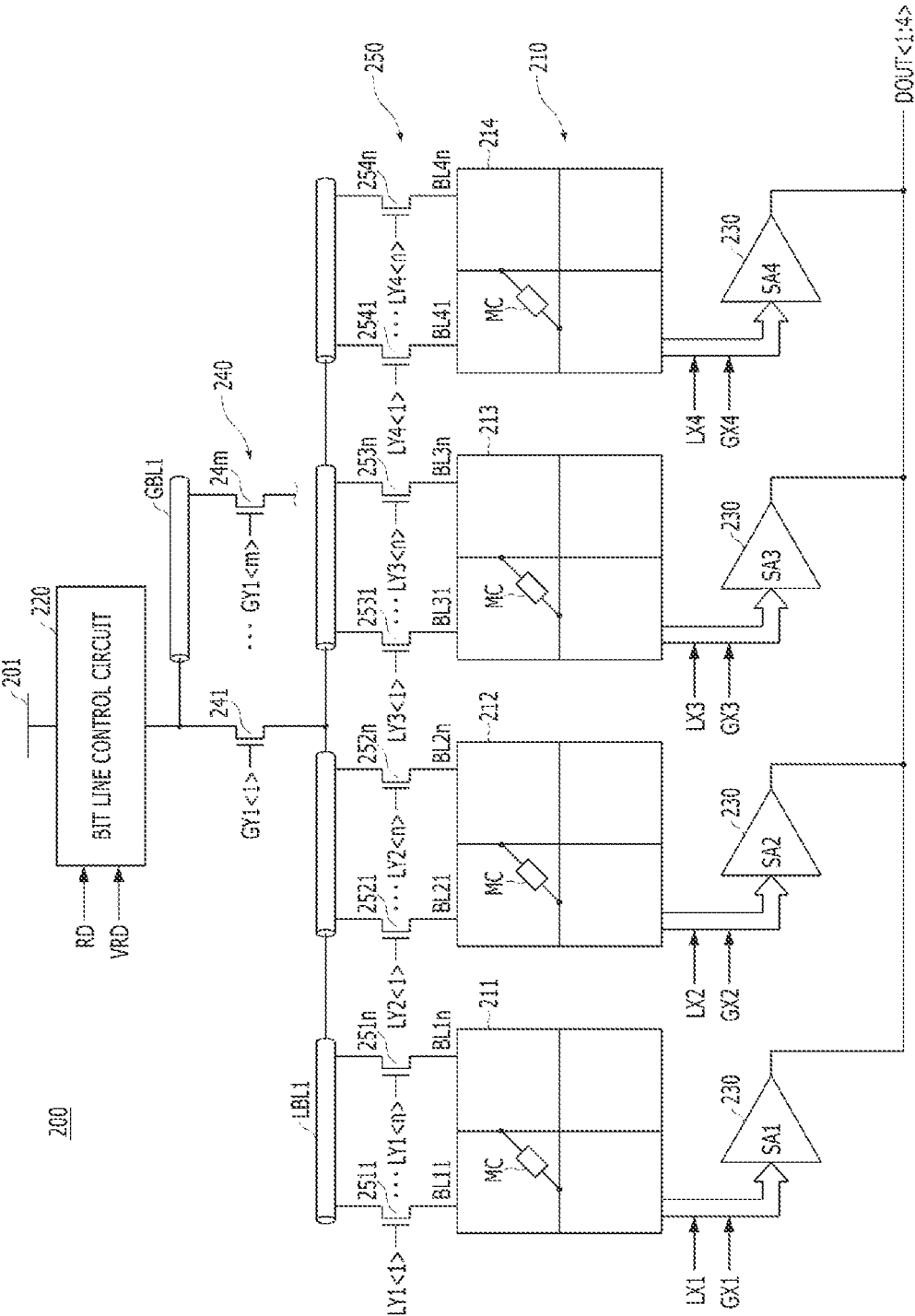
FIG. 2 is a diagram illustrating a configuration of a nonvolatile memory apparatus in accordance with an embodiment.

FIG. 2 is a diagram illustrating a configuration of a nonvolatile memory apparatus 200 in accordance with an embodiment. FIG. 2 illustrates partial elements configured to perform a read operation among the elements within the nonvolatile memory apparatus 100 illustrated in FIG. 1 in order to clearly describe a read operation of the nonvolatile memory apparatus 100. Referring to FIG. 2, the nonvolatile memory apparatus 200 may include a memory cell array 210, a bit line control circuit 220 and a plurality of sense amplifiers 230. The memory cell array 210 may include a plurality of memory banks each having a plurality of sub arrays. FIG. 2, for example, illustrates a single memory bank having four sub arrays within the memory cell array 210. First to fourth sub arrays 211, 212, 213 and 214 may have the same configuration and density as one another. The same number of bit lines and the same number of word lines may be disposed on the respective first to fourth sub arrays 211, 212, 213 and 214. A plurality of memory cells MC may be coupled to respective cross points between the plurality of bit lines and the plurality of word lines. Based on local column selecting signals LY1, LY2, LY3 and LY4, one bit line from among the plurality of bit lines on the first to fourth sub arrays 211, 212, 213 and 214 may be coupled to a local bit line LBL1. The local bit line LBL1 may be coupled to a global bit line GBL1 based on the global column selecting signal GY1.

Although not illustrated, the word lines on the first sub array 211 may be coupled to a first local word line based on a first local row selecting signal LX1 and the first local word line may be coupled to a first global word line based on a first global row selecting signal GX1. The word lines on the second sub array 212 may be coupled to a second local word line based on a second local row selecting signal LX2 and the second local word line may be coupled to a second global word line based on a second global row selecting signal GX2. The word lines on the third sub array 213 may be coupled to a third local word line based on a third local row selecting signal LX3 and the third local word line may be coupled to a third global word line based on a third global row selecting signal GX3. The word lines on the fourth sub array 214 may be coupled to a fourth local word line based on a fourth local row selecting signal LX4 and the fourth local word line may be coupled to a fourth global word line based on a fourth global row selecting signal GX4. The plurality of sense amplifiers 230 may be coupled to the first to fourth global word lines in one-to-one manner. The first sense amplifier SA1 may be coupled to the first global word line and may be coupled to one word line from among the word lines on the first sub array 211 through the first global word line and the first local word line. The second sense amplifier SA2 may be coupled to the second global word line and may be coupled to one word line from among the word lines on the second sub array 212 through the second global word line and the second local word line. The third sense amplifier SA3 may be coupled to the third global word line and may be coupled to one word line from among the word lines on the third sub array 213 through the third global word line and the third local word line. The fourth sense amplifier SA4 may be coupled to the fourth global word line and may be coupled to one word line from among the word lines on the fourth sub array 214 through the fourth global word line and the fourth local word line.

The bit line control circuit 220 may correspond to one or more partial elements within the column control circuit 123 illustrated in FIG. 1, Based on the read signal RD, the bit line control circuit 220 may provide the first voltage to the global bit line GBL1. The bit line control circuit 220 may be coupled to a power voltage node 201. Based on the read signal RD, the bit line control circuit 220 may provide the first voltage to the global bit line GBL1 to charge the global bit line GBL1. The bit line control circuit 220 may further receive a read reference voltage VRD. Based on the read reference voltage VRD, the bit line control circuit 220 may control the voltage level of the first voltage provided to the global bit line GBL1.

The first sense amplifier SA1 may read data from a memory cell MC within the first sub array 211 through the first global word line. The first sense amplifier SA1 may sense the high-resistance state or the low-resistance state of the accessed memory cell MC through the first global word line to generate output data DOUT<1:4>. For example, the first sense amplifier SA1 may sense the voltage level change of the first global word line and/or the amount of current flowing through the first global word line to generate the output data DOUT<1>. The second sense amplifier SA2 may read data from a memory cell MC within the second sub array 212 through the second global word line. The second sense amplifier SA2 may sense the voltage level change of the second global word line and/or the amount of current flowing through the second global word line to generate the output data DOUT<2>. The third sense amplifier SA3 may read data from a memory cell MC within the third sub array 213 through the third global word line. The third sense amplifier SA3 may sense the voltage level change of the third global word line and/or the amount of current flowing through the third global word line to generate the output data DOUT<3>. The fourth sense amplifier SA4 may read data from a memory cell MC within the fourth sub array 214 through the fourth global word line. The fourth sense amplifier SA4 may sense the voltage level change of the fourth global word line and/or the amount of current flowing through the fourth global word line to generate the output data DOUT<4>.

The nonvolatile memory apparatus 200 may further include a global column selecting circuit 240 and a local column selecting circuit 250. The global column selecting circuit 240 and the local column selecting circuit 250 may correspond to one or more partial elements within the column selecting circuit 122 illustrated in FIG. 1. The global column selecting circuit 240 may include a plurality of global column switches. The global bit line GBL1 may be coupled to 'm' number of local bit lines, 'm' being an integer equal to or greater than 2. The global column selecting circuit 240 may include 'm' number of global column switches 241 to 24m. The first global column switch 241 may receive a first bit GY1<1> of the global column selecting signal to couple the global bit line GBL1 and the local bit line LBL1 to each other. The m-th global column switch 24m may receive an n-th bit GY1<m> of the global column selecting signal to couple the global bit line GBL1 and a local bit line LBLm to each other, the local bit line LBLm being different from the local bit line LBL1. The local column selecting circuit 250 may include a plurality of local column switches. The local bit line LBL1 may be coupled to 'n' number of bit lines disposed on each of the first to fourth sub arrays 211, 212, 213 and 214, 'n' being an integer equal to or greater than 2. The local column selecting circuit 250 may include '4n' number of local column switches. A local column switch 2511 may receive a first bit LY1<1> of a first local column selecting signal to couple the local bit line LBL1 and a first bit line BL11 on the first sub array 211 to each other. A local column switch 251*n* may receive an nth bit LY1<n> of the first local column selecting signal to couple the local bit line LBL1 and an n-th bit line BL1*n* on the first sub array 211 to each other. A local column switch 2521 may receive a first bit LY2<1> of a second local column selecting signal to couple the local bit line LBL1 and a first bit line BL21 on the second sub array 212 to each other. A local column switch 252*n* may receive an nth bit LY2<n> of the second local column selecting signal to couple the local bit line LBL1 and an n-th bit line BL2*n* on the second sub array 212 to each other. A local column switch 2531 may receive a first bit LY3<1> of a third local column selecting signal to couple the local bit line LBL1 and a first bit line BL31 on the third sub array 213 to each other. A local column switch 253*n* may receive an n-th bit LY3<n> within the third local column selecting signal to couple the local bit line LBL1 and an n-th bit line BL3*n* on the third sub array 213 to each other. A local column switch 2541 may receive a first bit LY4<1> within a fourth local column selecting signal to couple the local bit line LBL1 and a first bit line BL41 on the fourth sub array 214 to each other. A local column switch 254*n* may receive an n-th bit LY4<n> within the fourth local column selecting signal to couple the local bit line LBL1 and an n-th bit line BL4*n* on the fourth sub array 214 to each other.

Although not illustrated, the nonvolatile memory apparatus 200 may further include a global row selecting circuit and a local row selecting circuit. The global row selecting circuit and the local row selecting circuit may correspond to one or more partial elements within the row selecting circuit 124 illustrated in FIG. 1. The global row selecting circuit may include a plurality of global row switches. The local row selecting circuit may include a plurality of local row switches. The global row selecting circuit may include at least four global row switches configured to receive the first to fourth global row selecting signals GX1, GX2, GX3 and GX4. The local row selecting circuit may include at least four local row switches configured to receive the first to fourth local row selecting signals LX1, LX2, LX3 and LX4.

Figure 3:
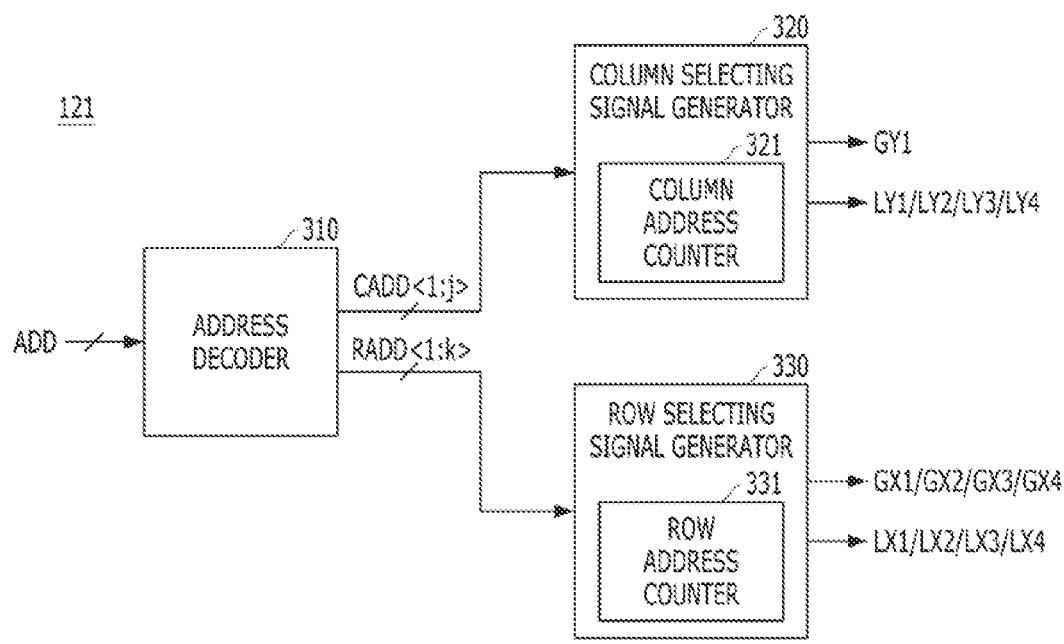
FIG. 3 is a diagram illustrating a configuration of at least a part of a controller illustrated in FIG. 1.

FIG. 3 is a diagram illustrating a configuration of at least a part of the controller 121 illustrated in FIG. 1. FIG. 3 illustrates partial elements related to the address signal ADD among the elements within the controller 121. Referring to FIG. 3, the controller 121 may include an address decoder 310, a column selecting signal generator 320 and a row selecting signal generator 330. The address decoder 310 may receive the address signal ADD to latch the address signal ADD. The address decoder 310 may decode the address signal ADD to generate the column address signal CADD<1:j> and the row address signal RADD<1:k>. Each of 'j' and 'k' may be an integer equal to or greater than 2 and 'j' and 'k' may be the same as or different from each other. The address decoder 310 may decode partial bits within the address signal ADD to generate the column address signal CADD<1:j> and may decode remaining bits within the address signal ADD to generate the row address signal RADD<1:k>. In an embodiment, the address decoder 310 may decrypt the address signal ADD according to a first scheme to generate the column address signal CADD<1:j> and may decrypt the address signal ADD according to a second scheme to generate the row address signal RADD<1:k>. In an embodiment, the address decoder 310 may decode first combination of the address signal ADD to generate the column address signal CADD<1:j> and may decode second combination of the address signal ADD to generate the row address signal RADD<1:k>.

The column selecting signal generator 320 may receive the column address signal CADD<1:j> provided from the address decoder 310. The column selecting signal generator 320 may generate the global column selecting signal GY1 and the first to fourth local column selecting signals LY1, LY2, LY3 and LY4 based on the code value of the column address signal CADD<1:j>. Based on the column address signal CADD<1:j>, the column selecting signal generator 320 may enable the global column selecting signal GY1 and may sequentially enable the first to fourth local column selecting signals LY1, LY2, LY3 and LY4. The column selecting signal generator 320 may include a column address counter 321. The column address counter 321 may change the code value of the column address signal CADD<1:j>. The column address counter 321 may change the code value of the column address signal CADD<1:j> as many times as a threshold number at each predetermined time interval. The predetermined time interval may be from when a read voltage is applied to a single memory cell to when output data is generated through a sense amplifier coupled to the single memory cell. The threshold number may be a number of sub arrays coupled to a single local bit line and may be an integer equal to or greater than 2. In an embodiment, the column address counter 321 may detect completion of a read operation on a memory cell, which is accessed on the basis of the column address signal CADD<1:j> provided from the address decoder 310, to change the code value of the column address signal CADD<1:j>. The column address counter 321 may detect completion of a read operation on a memory cell, which is accessed on the basis of the changed column address signal CADD<1:j>, to change the code value of the column address signal CADD<1:j> to another value. The column address counter 321 may change the logic values of partial bits within the column address signal CADD<1:j> to change the code value of the column address signal CADD<1:j>. The partial bits within the column address signal CADD<1:j> may have information for selecting a specific one sub array among the first to fourth sub arrays 211, 212, 213 and 214 illustrated in FIG. 2. Therefore, the column address counter 321 may allow at least one bit line on the first to fourth sub arrays 211, 212, 213 and 214 to be sequentially coupled to the local bit line LBL1 at each predetermined time interval. In an embodiment, the column address counter 321 may change the logic values of more number of bits than the partial bits within the column address signal CADD<1:j> to change the code value of the column address signal CADD<1:j>. The column address counter 321 may allow bit lines of different turns on the first to fourth sub arrays 211, 212, 213 and 214 to be sequentially coupled to the local bit line LBL1 at each predetermined time interval. For example, the column address counter 321 may allow the first bit line BL11 on the first sub array 211 to be coupled to the local bit line LBL1, and then the column address counter 321 may allow the n-th bit line BL2*n* on the second sub array 212 to be coupled to the local bit line LBL1.

The row selecting signal generator 330 may receive the row address signal RADD<1:k> provided from the address decoder 310. The row selecting signal generator 330 may generate the first to fourth global row selecting signals GX1, GX2, GX3 and GX4 and the first to fourth local row selecting signals LX1, LX2, LX3 and LX4 based on the code value of the row address signal RADD<1:k>. The row selecting signal generator 330 may enable the first to fourth global row selecting signals GX1, GX2, GX3 and GX4 and the first to fourth local row selecting signals LX1, LX2, LX3 and LX4 substantially at the same time. The row selecting signal generator 330 may include a row address counter 331. The row address counter 331 may change the code value of the row address signal RADD<1:k> to generate 4 number of row address signals having different code values from one another. Based on the 4 number of row address signals, the row selecting signal generator 330 may enable the first to fourth global row selecting signals GX1, GX2, GX3 and GX4 and the first to fourth local row selecting signals LX1, LX2, LX3 and LX4 substantially at the same time. In an embodiment, the row selecting signal generator 330 may simultaneously enable the first to fourth global row selecting signals GX1, GX2, GX3 and GX4 and the first to fourth local row selecting signals LX1, LX2, LX3 and LX4. The word "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Figure 4:
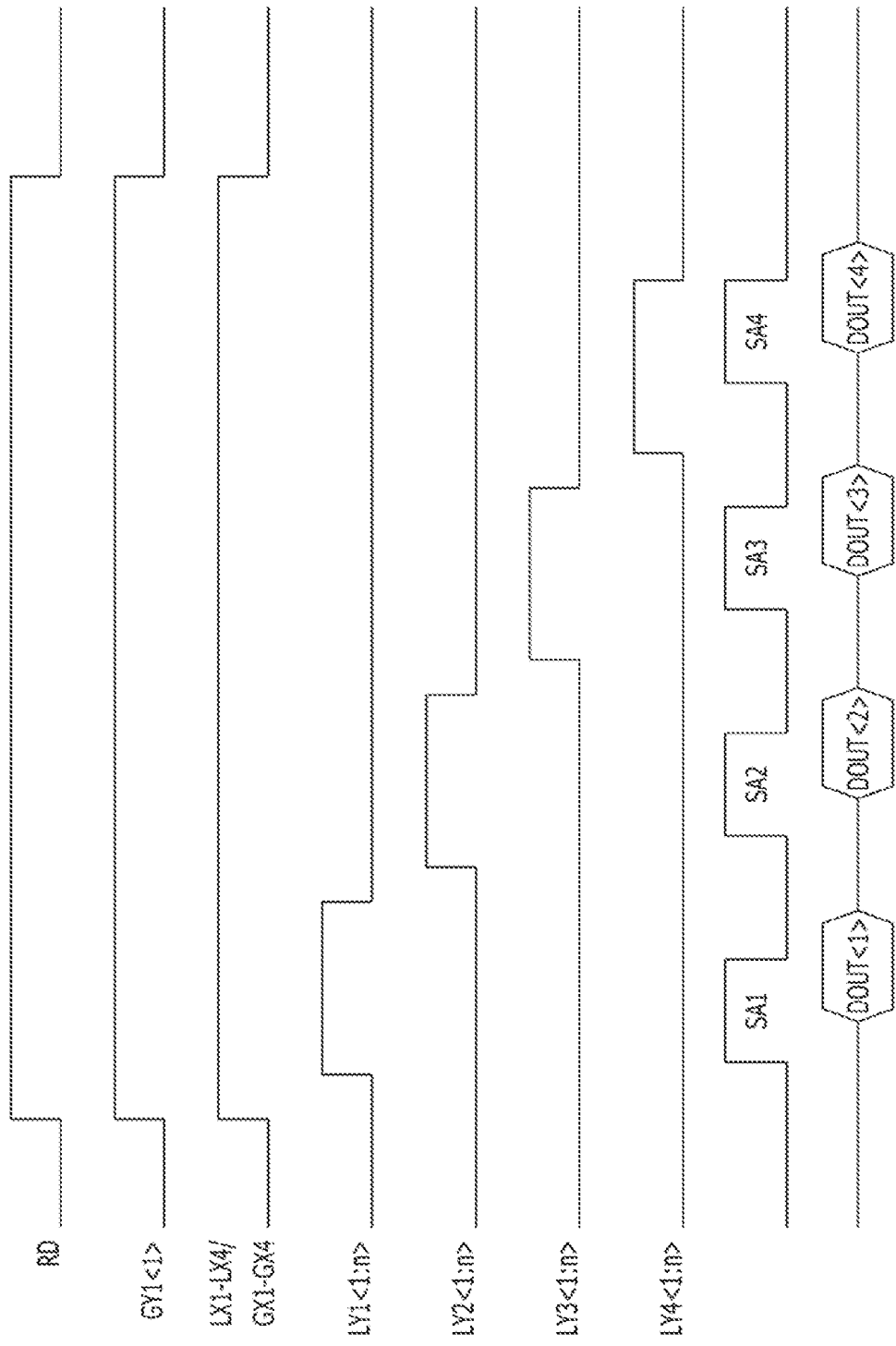
FIG. 4 is a timing diagram illustrating an operation of a nonvolatile memory apparatus in accordance with an embodiment.

FIG. 4 is a timing diagram illustrating an operation of the nonvolatile memory apparatus 200 in accordance with an embodiment. Hereinafter, described with reference to FIGS. 2 to 4 will be the operation of the nonvolatile memory apparatus 200 in accordance with an embodiment. When the read signal RD is enabled on the basis of the read command signal, the bit line control circuit 220 may charge the global bit line GBL1 to the first voltage. Based on the column address signal CADD<1:j> provided from the address decoder 310, the column selecting signal generator 320 may enable the first bit GY1<1> within the global column selecting signal GY1 and the global bit line GBL1 may be coupled to the local bit line LBL1 through the first global column switch 241. Therefore, the local bit line LBL1 may be charged to the first voltage.

Based on the row address signal RADD<1:k> provided from the address decoder 310, the row selecting signal generator 330 may enable the first to fourth global row selecting signals GX1, GX2, GX3 and GX4 and the first to fourth global word lines may be coupled respectively to the first to fourth local word lines. Based on the row address signal RADD<1:k> provided from the address decoder 310, the row selecting signal generator 330 may enable the first to fourth local row selecting signals LX1, LX2, LX3 and LX4 and specific word lines on the first to fourth sub arrays 211, 212, 213 and 214 may be coupled respectively to the first to fourth global word lines.

When the column address signal CADD<1:j> includes information for selecting the first sub array 211 among the first to fourth sub arrays 211, 212, 213 and 214, the column selecting signal generator 320 may enable one bit from among the bits of the first local column selecting signal LY1<1:n> based on the column address signal CADD<1:j> provided from the address decoder 310 and a specific bit line may be coupled to the local bit line LBL1 through one local column switch from among the local column switches 2511 to 251n. Therefore a read voltage may be applied to a memory cell MC coupled between the selected bit line and the selected word line on the first sub array 211. The first sense amplifier SA1 may be activated while the first local column selecting signal LY1<1:n> is enabled. The first sense amplifier SA1 may sense, according to the resistance state of the memory cell MC, the voltage level change of the first global word line and/or the amount of current flowing to through the first global word line to generate the first output data DOUT<1>.

When a predetermined amount of time elapses or the generation of the first output data DOUT<1> output from the first sub array 211 is detected, the column address counter 321 may change the code value of the column address signal CADD<1:j> provided from the address decoder 310 to a first value. The column selecting signal generator 320 may disable the first local column selecting signal LY1<1:n> to release the coupling between the local bit line LBL1 and the bit lines BL11 to BL1n on the first sub array 211. The column selecting signal generator 320 may enable one bit from among the bits of the second local column selecting signal LY2<1:n> based on the column address signal CADD<1:j> having the changed code value and a specific bit line may be coupled to the local bit line LBL1 through one local column switch from among the local column switches 2521 to 252n. Therefore, a read voltage may be applied to a memory cell MC coupled between the selected bit line and the selected word line on the second sub array 212. The second sense amplifier SA2 may be activated while the second local column selecting signal LY2<1:n> is enabled. The second sense amplifier SA2 may sense, according to the resistance state of the memory cell MC, the voltage level change of the second global word line and/or the amount of current flowing through the second global word line to generate the second output data DOUT<2>.

When the predetermined amount of time elapses again or to the generation of the second output data DOUT<2> output from the second sub array 212 is detected, the column address counter 321 may change the first value as the code value of the column address signal CADD<1:j> to a second value. The column selecting signal generator 320 may disable the second local column selecting signal LY2<1:n> to release the coupling between the local bit line LBL1 and the bit lines BL21 to BL2n on the second sub array 212. The column selecting signal generator 320 may enable one bit from among the bits of the third local column selecting signal LY3<1:n> based on the column address signal CADD<1:j> having the changed code value and a specific bit line may be coupled to the local bit line LBL1 through one local column switch from among the local column switches 2531 to 253n, Therefore, a read voltage may be applied to a memory cell MC coupled between the selected bit line and the selected word line on the third sub array 213. The third sense amplifier SA3 may be activated while the third local column selecting signal LY3<1:n> is enabled. The third sense amplifier SA3 may sense, according to the resistance state of the memory cell MC, the voltage level change of the third global word line and/or the amount of current flowing through the third global word line to generate the third output data DOUT<3>.

When the predetermined amount of time elapses again or the generation of the third output data DOUT<3> output from the third sub array 213 is detected, the column address counter 321 may change the second value as the code value of the column address signal CADD<1:j> to a third value. The column selecting signal generator 320 may disable the third local column selecting signal LY3<1:n> to release the coupling between the local bit line LBL1 and the bit lines BL31 to BL3n on the third sub array 213. The column selecting signal generator 320 may enable one bit from among the bits of the fourth local column selecting signal LY4<1:n> based on the column address signal CADD<1:j> having the changed code value and a specific bit line may be coupled to the local bit line LBL1 through one local column switch from among the local column switches 2541 to 254n. Therefore, a read voltage may be applied to a memory cell MC coupled between the selected bit line and the selected word line on the fourth sub array 214. The fourth sense amplifier SA4 may be activated while the fourth local column selecting signal LY4<1:n> is enabled. The fourth sense amplifier SA4 may sense, according to the resistance state of the memory cell MC, the voltage level change of the fourth global word line and/or the amount of current flowing through the fourth global word line to generate the fourth output data DOUT<4>.

Since the code value of the column address signal CADD<1:j> has been changed as many times as the threshold number, the column selecting signal generator 320 might not further change the code value of the column address signal CADD<1:j> and the fourth local column selecting signal LY4<1:n> may become disabled to release the coupling between the local bit line LBL1 and the bit lines BL41 to BL4n on the fourth sub array 214. The bit line control circuit 220 may discharge the global bit line GBL1 and the local bit line LBL1 and the global column selecting signal GY1, the first to fourth global row selecting signals GX1, GX2, GX3 and GX4 and the first to fourth local row selecting signals LX1, LX2, LX3 and LX4 may become disabled. The read operation of the nonvolatile memory apparatus 200 may end as the read signal RD becomes disabled.

Since the global bit line coupled to the bit line control circuit is coupled to the plurality of local bit lines each coupled to the plurality of bit lines, loads are significantly great on the global bit line and the plurality of local bit lines. Therefore, a considerable amount of power may be consumed to charge the global bit line. Therefore, it may be of substantially low energy efficiency to read data from a single memory cell within a single sub array during a read operation being performed in response to a single read command signal. According to an embodiment, the nonvolatile memory apparatus may sequentially read data from memory cells within a plurality of sub arrays during a read operation being performed in response to a single read command signal. That is, since a read operation is performed to sequentially read data from a plurality of memory cells after charging a single global bit line and a single local bit line, the energy efficiency of the read operation may be improved. Further, since it is possible for the nonvolatile memory apparatus to perform a read operation of reading data from a plurality of memory cells in response to a single read command signal, it may be possible to increase a page size of the nonvolatile memory apparatus.

Figure 5:
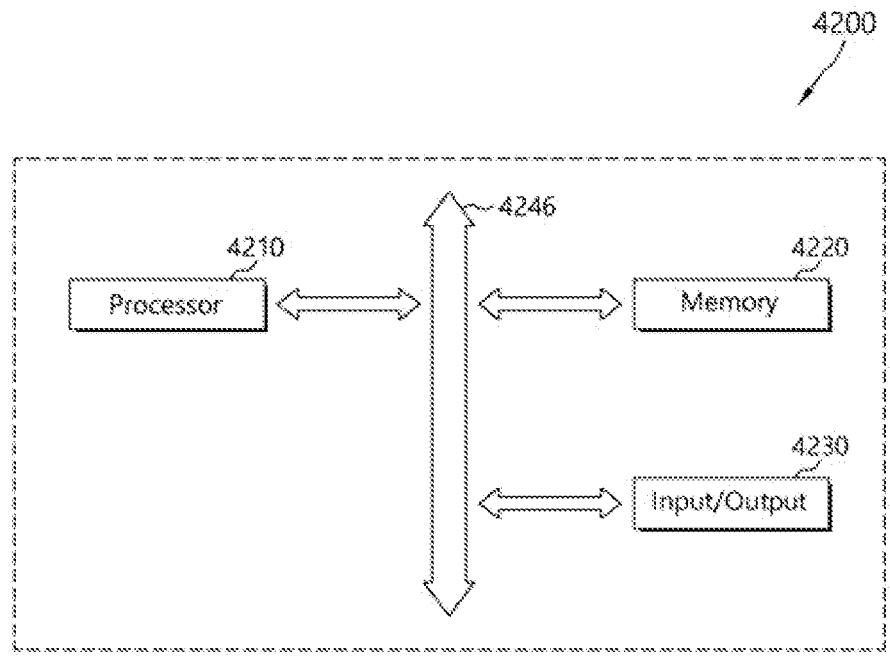
FIG. 5 is a block diagram illustrating an electronic apparatus including a semiconductor memory apparatus in accordance with an embodiment.

FIG. 5 is a block diagram illustrating an electronic apparatus including a semiconductor memory apparatus in accordance with an embodiment. Referring to FIG. 5, the electronic apparatus 4200 may include a processor 4210, a memory 4220 and an input/output device (I/O) 4230. The processor 4210, the memory 4220, and the input/output device 4230 may be coupled through a bus 4246.

The memory 4220 may receive a control signal from the processor 4210. The memory 4220 may store a code and data for the operation of the processor 4210. The memory 4220 may be utilized to store data to be accessed through the bus 4246. The memory 4220 may include at least one between the nonvolatile memory apparatuses 100 and 200 described above. In order for concrete realization and modification of an embodiment, an additional circuit and an additional control signal may be provided.

The electronic apparatus 4200 may configure various electronic control apparatuses requiring the memory 4220. For example, the electronic apparatus 4200 may be utilized in a computer system, a wireless communication device, a personal digital assistant (PDA), a laptop computer, a portable computer, a web tablet, a wireless phone, a portable phone, a digital music player, a MPEG audio layer 3 (MP3) player, a navigator, a solid state disk (SSD), a household appliance, or all devices capable of transmitting and receiving information under wireless circumstances.

Figure 6:
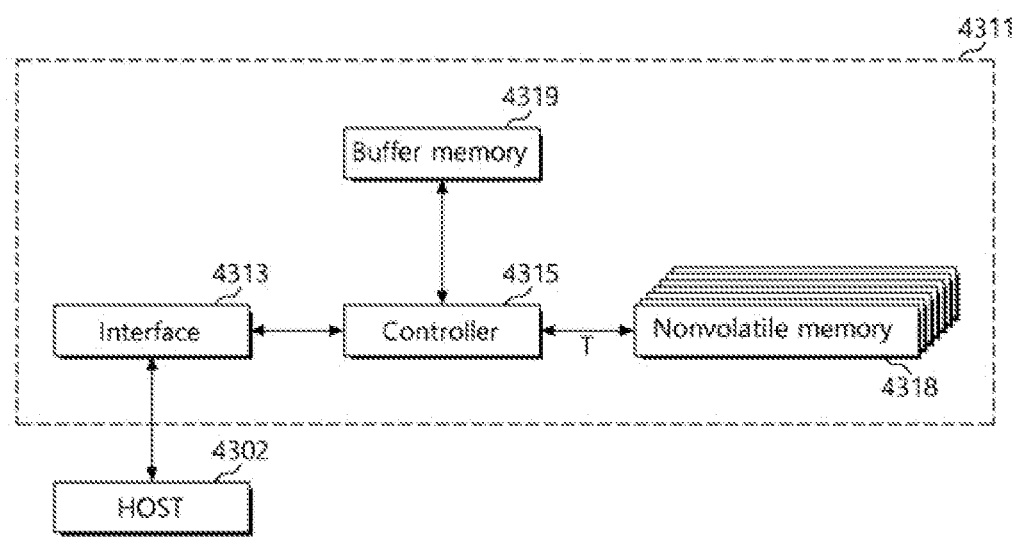
FIG. 6 is a block diagram illustrating a data storage device including a semiconductor memory apparatus in accordance with an embodiment.

FIG. 6 is a block diagram illustrating a data storage device including a semiconductor memory apparatus in accordance with an embodiment. Referring to FIG. 6, a data storage device such as a solid state disk (SSD) 4311 may be provided. The solid state disk 4311 may include an interface 4313, a controller 4315, nonvolatile memories 4318 and a buffer memory 4319.

The solid state disk 4311 stores information by utilizing a semiconductor device. The solid state disk 4311 has advantages of a high operation speed, reduced mechanical delay, low failure rate, low heat generation, low noise generation, a small size and a light weight when compared with a hard disk drive (HDD). The solid state disk 4311 may be widely utilized in a notebook PC, a net book, a desktop PC, an MP3 player or a portable storage device.

The controller 4315 may be provided adjacent to the interface 4313 and may be electrically coupled to the interface 4313, The controller 4315 may be a microprocessor including a memory controller and a buffer controller. The nonvolatile memories 4318 may be provided adjacent to the controller 4315 and may be electrically coupled to the controller 4315 via connection terminals T. The data storage capacity of the solid state disk 4311 may correspond to the nonvolatile memories 4318. The buffer memory 4319 may be provided adjacent to the controller 4315 and may be electrically coupled to the controller 4315.

The interface 4313 may be coupled to a host 4302 and may transfer electrical signals such as data. For example, the interface 4313 may operate according to standards such as the Serial Advanced Technology Attachment (SATA), the Integrated Drive Electronics (IDE), the Small Computer System Interface (SCSI) and/or combination thereof. The nonvolatile memories 4318 may be coupled to the interface 4313 via the controller 4315.

The nonvolatile memories 4318 may store data received through the interface 4313. The nonvolatile memories 4318 may include at least one between the nonvolatile memory apparatuses 100 and 200 in accordance with an embodiment, as described above. The nonvolatile memories 4318 have a characteristic that the data stored therein are retained even when power supply to the solid state disk 4311 is cut off.

The buffer memory 4319 may include a volatile memory or a nonvolatile memory. The volatile memory may be a DRAM and/or an SRAM. The nonvolatile memory may include at least one between the nonvolatile memory apparatuses 100 and 200 in accordance with an embodiment, as described above.

The data processing speed of the interface 4313 may be relatively fast when compared with the operation speed of the nonvolatile memories 4318. The buffer memory 4319 may temporarily store data. The data received through the interface 4313 may be temporarily stored in the buffer memory 4319 via the controller 4315, and then, may be non-temporarily stored in the nonvolatile memories 4318 in conformity with the data writing speed of the nonvolatile memories 4318.

The data frequently used among the data stored in the nonvolatile memories 4318 may be read in advance and may be temporarily stored in the buffer memory 4319. The buffer memory 4319 may increase the effective operation speed of the solid state disk 4311 and may decrease an error occurrence rate of the solid state disk 4311.

While certain embodiments have been described above, it will be understood to those skilled in the art that the embodiments described are by way of example only. Accordingly, the nonvolatile memory apparatus performing consecutive access operations and an operation method of the nonvolatile memory apparatus should not be limited based on the described embodiments. Rather, the nonvolatile memory apparatus performing consecutive access operations and an operation method of the nonvolatile memory apparatus described herein should only be limited in light of the claims that follow when taken in conjunction with the above description and accompanying drawings.

What is claimed is:

1. A nonvolatile memory apparatus comprising:
a memory cell array including a plurality of sub arrays each including a plurality of memory cells coupled to a plurality of bit lines; and
a memory control circuit configured to sequentially couple to, based on a single read command signal, at least one bit line disposed on the respective sub arrays, which are coupled to a local bit line, to sequentially read data from a memory cell coupled to the at least one bit line,
wherein the local bit line is coupled to a global bit line.

2. The nonvolatile memory apparatus of claim 1, wherein the memory control circuit includes a column selecting circuit configured to couple at least one bit line disposed on the respective sub arrays to the local bit line and couple the local bit line to the global bit line, based on a column selecting signal generated on a basis of an address signal provided together with the single read command signal.

3. The nonvolatile memory apparatus of claim 2, wherein the memory control circuit is configured to charge the global bit line and the local bit line to a column access voltage based on the single read command signal.

4. The nonvolatile memory apparatus of claim 2, wherein the column selecting signal includes a global column selecting signal for coupling the local bit line to the global bit line and a local column selecting signal to couple the at least one bit line disposed on the respective sub arrays to the local bit line.

5. The nonvolatile memory apparatus of claim 1, wherein the memory control circuit includes a row selecting circuit configured to couple, respectively to different local word lines and different global word lines, word lines coupled to memory cells coupled to at least one bit line disposed on the respective sub arrays, based on an address signal provided together with the single read command signal.

6. The nonvolatile memory apparatus of claim 5, wherein the memory control circuit includes a row control circuit coupled to the global word lines and configured to read data from memory cells coupled to at least one bit line disposed on the respective sub arrays.

7. The nonvolatile memory apparatus of claim 2, wherein the memory control circuit further includes a controller configured to generate a column address signal based on the address signal, and sequentially enable a plurality of different local column selecting signals while a global column selecting signal is enabled on a basis of the column address signal,
wherein the column selecting circuit configured to select the local bit line to be coupled to the global bit line based on the global column selecting signal, and configured to couple at least one bit line disposed on the respective sub arrays to the local bit line based on the plurality of different local column selecting signals.

8. The nonvolatile memory apparatus of claim 7, wherein the controller is configured to sequentially enable the plurality of local column selecting signals such that the respective local column selecting signals are exclusively enabled among one another.

9. The nonvolatile memory apparatus of claim 7, wherein the controller is configured to sequentially enable the plurality of local column selecting signals by changing information of the column address signal for selecting a specific sub array among the plurality of sub arrays.

10. The nonvolatile memory apparatus of claim 9, wherein the controller includes a column address counter configured to increase or decrease a code value of bits of the column address signal which correspond to the information for selecting the specific sub array among the plurality of sub arrays.

11. The nonvolatile memory apparatus of claim 7, wherein the controller is configured to generate a row address signal based on the address signal and generate a plurality of different global row selecting signals and a plurality of different local row selecting signals based on the row address signal.

12. The nonvolatile memory apparatus of claim 11, further comprising a row selecting circuit configured to couple the at least one bit line on the respective sub arrays to different local word lines based on the plurality of different local row selecting signals and couple the different local word lines to different global word lines based on the plurality of different global row selecting signals.

13. The nonvolatile memory apparatus of claim 5, wherein the memory control circuit further includes a plurality of sense amplifiers respectively coupled to a plurality of memory cells coupled to the at least one bit line on the respective sub arrays and configured to read data from the plurality of memory cells to generate output data,
wherein the plurality of sense amplifiers are coupled to the different global word lines in one-to-one manner.

14. A nonvolatile memory apparatus comprising:
a first sub array;
a second sub array; and
a memory control circuit configured to charge a global bit line and a local bit line coupled to the global bit line based on a single read command signal,
wherein the memory control circuit is configured to couple the local bit line to a first bit line of the first sub array to read data from a memory cell coupled to the first bit line, and then is configured to couple the local bit line to a second bit line of the second sub array to read data from a memory cell coupled to the second bit line.

15. The nonvolatile memory apparatus of claim 14, wherein the memory control circuit is configured to couple the local bit line and the first bit line to each other based on a column address signal generated on a basis of an address signal provided together with the sing read command signal, and to generate output data according to a resistance state of the memory cell coupled to the first bit line.

16. The nonvolatile memory apparatus of claim 15, wherein the memory control circuit is configured to release the coupling between the local bit line and the first bit line, to couple the local bit line and the second bit line to each other by changing a code value of the column address signal, and to generate the output data according to a resistance state of the memory cell coupled to the second bit line.

\* \* \* \* \*